(12) United States Patent
Ohtani

(10) Patent No.: US 10,819,293 B2
(45) Date of Patent: Oct. 27, 2020

(54) POWER AMPLIFIER

(71) Applicant: YAMAHA CORPORATION, Hamamatsu-shi (JP)

(72) Inventor: Yohei Ohtani, Iwata (JP)

(73) Assignee: YAMAHA CORPORATION, Hamamatsu-Shi (JP)

( * ) Notice: Subject to any disclaimer, the term of this patent is extended or adjusted under 35 U.S.C. 154(b) by 42 days.

(21) Appl. No.: 16/383,818

(22) Filed: Apr. 15, 2019

(65) Prior Publication Data

US 2019/0245494 A1 Aug. 8, 2019

Related U.S. Application Data

(63) Continuation of application No. PCT/JP2017/036987, filed on Oct. 12, 2017.

(30) Foreign Application Priority Data

Oct. 21, 2016 (JP) .................................. 2016-207035

(51) Int. Cl.
*H03G 3/30* (2006.01)
*H03F 1/34* (2006.01)
*H03F 3/21* (2006.01)
*H03F 3/217* (2006.01)
(Continued)

(52) U.S. Cl.
CPC ............... *H03F 1/34* (2013.01); *H03F 3/187* (2013.01); *H03F 3/211* (2013.01); *H03F 3/217* (2013.01);
(Continued)

(58) Field of Classification Search
CPC .......................................................... H03G 3/30
USPC .................................................... 330/279, 75
See application file for complete search history.

(56) References Cited

U.S. PATENT DOCUMENTS 7,522,368 B2 * 4/2009 Xia ...................... G11B 5/5526
318/568.22
7,986,187 B1 7/2011 Nussbaum et al.
(Continued)

FOREIGN PATENT DOCUMENTS

JP        S5587016 U    6/1980
JP        S63111710 A   5/1988
(Continued)

OTHER PUBLICATIONS

International Search Report issued in Intl. Appln. No. PCT/JP2017/036987 dated Jan. 9, 2018. English translation provided.
(Continued)

*Primary Examiner* — Henry Choe
(74) *Attorney, Agent, or Firm* — Rossi, Kimms & McDowell LLP

(57) ABSTRACT

A power amplifier includes a signal input unit to which an input signal is applied, an output stage that is electrically isolated from the signal input unit, where the output stage is configured to amplify an output signal of the signal input unit based on a power supply voltage from a floating power supply, a reference potential switch that is inserted between a reference node of the power supply voltage generated by the floating power supply and a reference potential line, and a feedback circuit configured to amplify a differential voltage between an output node of the output stage and the reference node, and feed the resultant voltage back to the signal input unit.

4 Claims, 15 Drawing Sheets

(51) Int. Cl.
*H03F 3/45* (2006.01)
*H03F 3/187* (2006.01)

(52) U.S. Cl.
CPC ......... *H03F 3/2171* (2013.01); *H03F 3/2178* (2013.01); *H03F 3/45475* (2013.01); *H03F 2200/03* (2013.01); *H03F 2200/129* (2013.01); *H03F 2200/144* (2013.01); *H03F 2200/171* (2013.01); *H03F 2200/267* (2013.01); *H03F 2200/351* (2013.01); *H03F 2200/537* (2013.01); *H03F 2203/21157* (2013.01)

(56) References Cited

U.S. PATENT DOCUMENTS

| | | | |
|---|---|---|---|
| 8,890,608 B2* | 11/2014 | Sahandiesfanjani | ............................ H03F 3/2175 330/10 |
| 10,554,189 B2* | 2/2020 | Lesso | .................... H03F 3/2175 |
| 2007/0236825 A1* | 10/2007 | Xia | ..................... H02P 25/034 360/78.04 |
| 2013/0088294 A1 | 4/2013 | Heineman et al. | |

FOREIGN PATENT DOCUMENTS

| | | |
|---|---|---|
| JP | 2009100352 A | 5/2009 |
| JP | 2013521699 A | 6/2013 |
| WO | 2011109152 A1 | 9/2011 |

OTHER PUBLICATIONS

Written Opinion issued in Intl. Appln. No. PCT/JP2017/036987 dated Jan. 9, 2018.

* cited by examiner

US 10,819,293 B2

POWER AMPLIFIER

CROSS REFERENCE TO RELATED APPLICATIONS

This application is a Continuation application of PCT Application No. PCT/JP2017/036987, filed Oct. 12, 2017, and is based on, and claims priority from, Japanese Patent Application No. 2016-207035, filed Oct. 21, 2016, the entire contents of which are incorporated herein by reference.

BACKGROUND OF THE INVENTION

Field of the Invention

The present disclosure relates to power amplifiers that drive a load such as a speaker.

Description of Related Art

In an acoustic system, power amplifiers may be used in combination in response to a required volume or the like. For example, Japanese Translation of PCT International Application Publication No. JP-T-2013-521699 (hereinafter, Patent Document 1) discloses that power amplifiers are connected in parallel, and a common speaker is driven by the power amplifiers connected in parallel.

In the above-described technique disclosed in the Patent Document 1 described above, the power amplifiers are connected in parallel such that a high current exceeding a maximum output current of one power amplifier can flow through the speaker. However, there may be a demand to increase a voltage to be applied to a speaker in some acoustic systems. The technique disclosed in Patent Document 1 cannot satisfy this demand. In order to increase the voltage to be applied to the speaker, it is conceivable to connect two power amplifiers in a Bridged Transless (BTL) manner. However, according to a principle of the BTL connection, the number of connected power amplifiers is limited to two. Accordingly, a voltage to be applied to the speaker cannot be increased to three or more times an output voltage of one power amplifier. Therefore, in order to increase the voltage to be applied to a speaker, it is conceivable to connect output stages of power amplifiers in series. In this configuration, output voltages of the respective output stages of the power amplifiers are added, and then the sum of the voltages is applied to the speaker.

However, conventionally, it is difficult to adopt this configuration. In general, a power amplifier has a feedback circuit that negatively feeds an output signal of the power amplifier back to an input side in order to realize an amplification operation with less distortion. Here, when the output stages of the power amplifiers are connected in series, the output signals of the respective power amplifiers are different from each other. Therefore, it is difficult to design each feedback circuit such that an appropriate feedback operation is performed in each power amplifier.

SUMMARY

The present disclosure has been made in view of the above circumstances and has an object of providing power amplifiers in which output stages of power amplifiers are connectable in series.

The present disclosure provides a power amplifier including: a signal input unit to which an input signal is applied; an output stage that is electrically isolated from the signal input unit, where the output stage is configured to amplify an output signal of the signal input unit based on a power supply voltage from a floating power supply; a reference potential switch that is inserted between a reference node of the power supply voltage generated by the floating power supply and a reference potential line; and a feedback circuit configured to amplify a differential voltage between the reference node and an object driven by an output of the output stage, and feed the amplified differential voltage back to the signal input unit.

DESCRIPTION OF THE EMBODIMENTS

Embodiments of the present disclosure will be described below with reference to the drawings.

Figure 1:
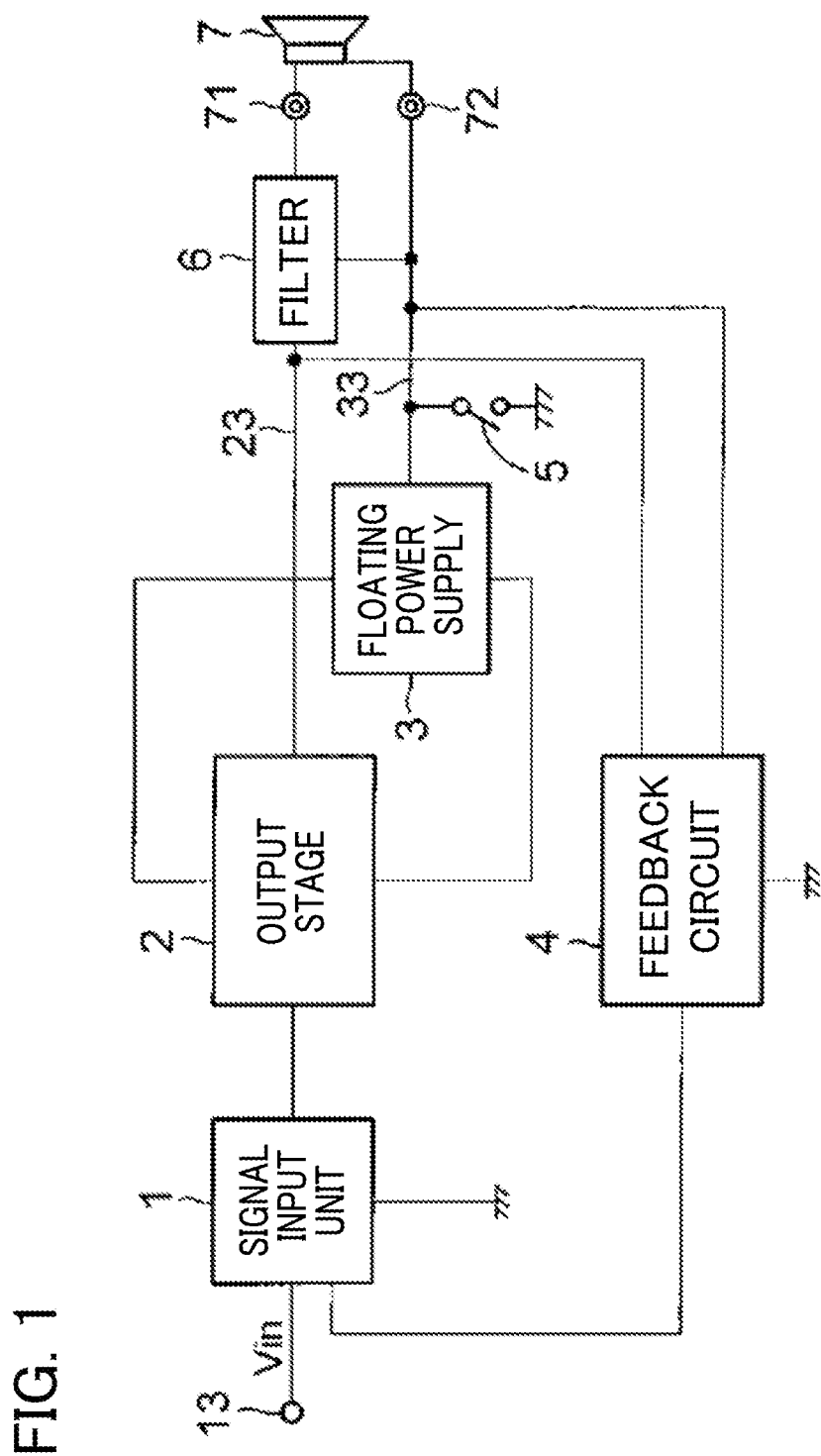
FIG. 1 is a block diagram showing a functional configuration of a power amplifier according to an embodiment of the present disclosure.

FIG. 1 is a block diagram showing a functional configuration of a power amplifier according to an embodiment of the present disclosure. In FIG. 1, a speaker 7 is also shown together with a power amplifier in order to facilitate understanding of a configuration of the power amplifier. This power amplifier includes a signal input unit 1, an output stage 2, a floating power supply 3, a feedback circuit 4, a reference potential switch 5, and a filter 6. An input signal Vin is input from an input terminal 13 to the signal input unit 1. The output stage 2 is electrically isolated from the signal input unit 1 and amplifies an output signal of the signal input unit 1 based on a power supply voltage from the floating power supply 3. The reference potential switch 5 is inserted between a reference node 33 of the power supply voltage generated by the floating power supply 3 and a reference potential line (a ground line in the example shown in FIG.

1). The filter 6 passes a component in an audio band among components of a differential voltage between an output node 23 of the output stage 2 and the reference node 33 of the floating power supply 3. The feedback circuit 4 amplifies a differential voltage between the output node 23 of the output stage 2 and the reference node 33 and supplies a feedback signal to the signal input unit 1. An output node of the filter 6 and the reference node 33 are connected to speaker terminals 71 and 72 for connection of the speaker 7, respectively. When this power amplifier is operated as the sole power amplifier, the reference potential switch 5 is turned to be in the ON state.

Figure 2:
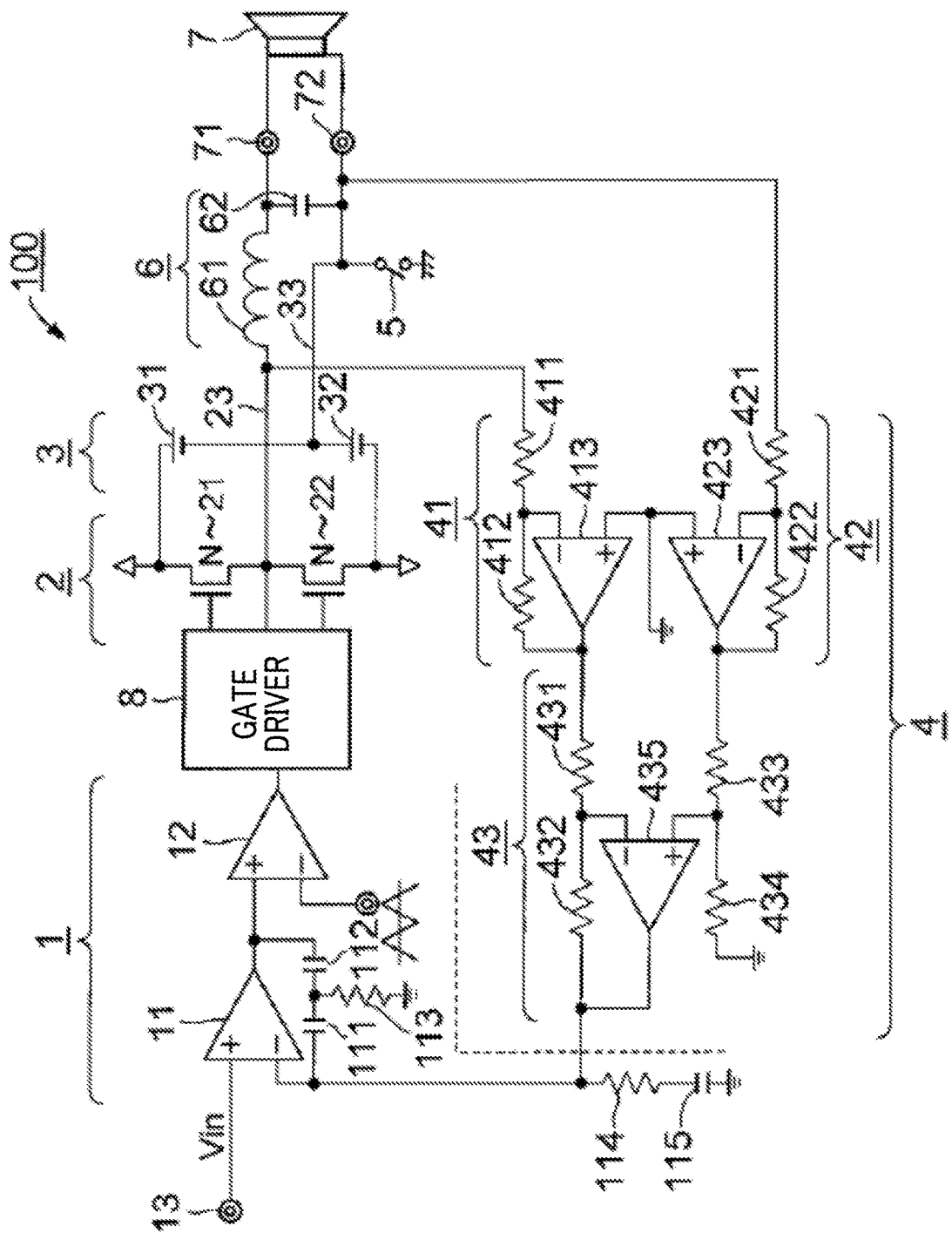
FIG. 2 is a circuit diagram showing a specific configuration example of the power amplifier.

FIG. 2 is a circuit diagram showing a configuration of a power amplifier 100 that is a specific example of the power amplifier according to the embodiment. This power amplifier 100 is a class-D amplifier. In FIG. 2, an isolation type gate driver 8 is shown as a component of the power amplifier 100, which component is not shown in FIG. 1.

As shown in FIG. 2, a signal input unit 1 includes an operational amplifier 11, a comparator 12, capacitors 111 and 112, a resistor 113, a resistor 114, and a capacitor 115. An input signal Vin from an input terminal 13 is applied to a non-inverting input terminal of the operational amplifier 11. The capacitors 112 and 111 are connected in series between an output terminal and an inverting input terminal of the operational amplifier 11. A node between the capacitors 111 and 112 is grounded via the resistor 113. The resistors 114 and 115 are connected in series between the inverting input terminal of the operational amplifier 11 and the ground line.

The operational amplifier 11, the capacitors 111 and 112, and the resistor 113 constitute a second-order error integrator that integrates an error between the input signal Vin and the feedback signal from the feedback circuit 4. This error integrator may be a first-order error integrator that includes only capacitors without the resistor 113 on a feedback path between the output terminal of the operational amplifier 11 and the inverting input terminal. In addition, the resistor 114 is an input resistor of the operational amplifier 11 in FIG. 2. The capacitor 115 obtains, from a signal that is fed back through the feedback circuit 4, a signal (an audio signal) to be amplified at a desired amplification rate and suppresses a DC component that is not required to be amplified.

The output signal of the operational amplifier 11 is applied to a non-inverting input of the comparator 12. A carrier signal at a predetermined frequency output from a periodic waveform generation circuit (not shown) is applied to an inverting input terminal of the comparator 12. This carrier signal is, for example, a triangular wave signal. The comparator 12 compares the output signal of the operational amplifier 11 with the carrier signal, to output a pulse width modulation (PWM) pulse train that is pulse width modulated by the output signal of the operational amplifier 11.

The isolation type gate driver 8 is a circuit that transfers the PWM pulse train output by the signal input unit 1 to the output stage 2 in a state in which the circuit electrically isolates between the signal input unit 1 and the output stage 2. Various circuits may be used for the isolation type gate driver 8. For example, this isolation type gate driver 8 may be configured with a photocoupler or a transistor. Alternatively, the isolation type gate driver 8 may be configured with a modulation circuit and a demodulation circuit. The modulation circuit performs ON/OFF-keying (modulation) on a high frequency signal using the PWM pulse train output by the signal input unit 1. The demodulation circuit receives and modulates the modulated high frequency signal via an insulator.

The output stage 2 includes two N-channel MOSFETs (Metal Oxide Semiconductor Field Effect Transistors; hereinafter simply referred to as transistors) 21 and 22. The N-channel transistors 21 and 22 are connected in series between a positive terminal and a negative terminal of the floating power supply 3. A node between the N-channel transistors 21 and 22 serves as an output node 23 of the output stage 2.

When the output signal of the signal input unit 1 is, for example, at a Low level (hereinafter, L level), the isolation type gate driver 8 outputs a voltage for turning OFF the N-channel transistor 21 between a gate and a source of the N-channel transistor 21, and outputs a voltage for turning ON the N-channel transistor 22 between a gate and a source of the N-channel transistor 22. Accordingly, a negative terminal of the floating power supply 3 is connected to the output node 23 via the N-channel transistor 22. Furthermore, when the output signal of the signal input unit 1 is, for example, at a High level (hereinafter, H level), the isolation type gate driver 8 outputs a voltage for turning ON the N-channel transistor 21 between the gate and the source of the N-channel transistor 21, and outputs a voltage for turning OFF the N-channel transistor 22 between the gate and the source of the N-channel transistor 22. Accordingly, a positive terminal of the floating power supply 3 is connected to the output node 23 via the N-channel transistor 21.

In this example, the floating power supply 3 includes two DC power supplies 31 and 32 with the same power supply voltage that are connected in series. A positive terminal of the DC power supply 31 serves as a positive terminal of the floating power supply 3, and a negative terminal of the DC power supply 32 serves as a negative terminal of the floating power supply 3. Furthermore, a neutral point to which a negative terminal of the DC power supply 31 and the positive terminal of the DC power supply 32 are connected serves as the reference node 33 of the floating power supply 3. A potential of this reference node 33 serves as a reference potential of the power supply voltage that is generated by the floating power supply 3. The reference potential switch 5 is inserted between this reference node 33 and the ground line, which is a reference potential line.

A filter 6 is provided between the output node 23 of the output stage 2 and the reference node 33 of the floating power supply 3, and speaker terminals 71 and 72 at both ends of the speaker 7. In the example shown, the filter 6 includes an inductor 61 and a capacitor 62. The inductor 61 is connected between the output node 23 and the speaker terminal 71. The capacitor 62 is connected between the speaker terminals 71 and 72. The speaker terminal 72 is connected to the reference node 33.

The feedback circuit 4 is a circuit that amplifies a differential potential between the output node 23 of the output stage 2 and the reference node 33 and supplies a feedback signal to the signal input unit 1. The feedback circuit 4 includes inverting amplifiers 41 and 42 and a differential amplifier 43.

The inverting amplifier 41 includes resistors 411 and 412 and an operational amplifier 413. The resistor 411 is connected between the output node 23 of the output stage 2 and an inverting input terminal of the operational amplifier 413. The resistor 412 is connected between an output terminal of the operational amplifier 413 and the inverting input terminal of the operational amplifier 413. A non-inverting input of the operational amplifier 413 is grounded. The inverting amplifier 41 outputs a voltage obtained by inverting a polarity of a differential voltage between the output node 23 of the output stage 2 and the ground line and multiplying the differential voltage having the inverted polarity by a ratio of a resistance value of the resistor 412 to a resistance value of the resistor 411.

The inverting amplifier 42 includes resistors 421 and 422, and an operational amplifier 423. A configuration of the inverting amplifier 42 is the same as that of the inverting amplifier 41. The inverting amplifier 42 outputs a voltage obtained by inverting a polarity of a differential voltage between the reference node 33 (=speaker terminal 72) of the floating power supply 3 and the ground line and multiplying the differential voltage having the inverted polarity by a ratio of a resistance value of the resistor 422 to a resistance value of the resistor 421.

The differential amplifier 43 includes resistors 431 to 434 and an operational amplifier 435. The resistor 431 is connected between an output terminal of the inverting amplifier 41 and an inverting input terminal of the operational amplifier 435. The resistor 432 is connected between an output terminal of the operational amplifier 435 and the inverting input terminal of the operational amplifier 435. The resistor 433 is connected between an output terminal of the inverting amplifier 42 and a non-inverting input terminal of the operational amplifier 435. The resistor 434 is connected between a non-inverting input of the operational amplifier 435 and the ground line. A ratio of resistance values between the resistors 431 and 432 is equal to a ratio of resistance values between the resistors 433 and 434. The output terminal of the operational amplifier 435 is connected to the inverting input terminal of the operational amplifier 11 of the signal input unit 1. This differential amplifier 43 outputs, as a feedback signal from the operational amplifier 435, a voltage obtained by inverting a polarity of a differential voltage between an output voltage of the inverting amplifier 41 and an output voltage of the inverting amplifier 42 and multiplying the differential voltage having the inverted polarity by a ratio of a resistance value of the resistor 432 to a resistance value of the resistor 431.

As described above, the inverting amplifier 41 outputs a voltage having a polarity opposite to that of the differential voltage between the output node 23 of the output stage 2 and the ground line. Furthermore, the inverting amplifier 42 outputs a voltage having a polarity opposite to that of the differential voltage between the reference node 33 of the floating power supply 3 and the ground line. Accordingly, the differential amplifier 43 outputs a voltage having the same polarity as that of a differential voltage between the output node 23 of the output stage 2 and the reference node 33 of the floating power supply 3. Furthermore, a gain of the entire feedback circuit 4 is a gain obtained by multiplying the following two ratios together. The first one of the two ratios is the ratio of the resistance value of the resistor 412 to the resistance value of the resistor 411 (=the ratio of the resistance value of the resistor 422 to the resistance value of the resistor 421). The second one is the ratio of the resistance value of the resistor 432 to the resistance value of the resistor 431 (=the ratio of the resistance value of the resistor 434 to the resistance value of the resistor 433). This is a configuration of the power amplifier 100 shown in FIG. 2.

In the above-described configuration, when the power amplifier 100 is operated as the sole power amplifier, the reference potential switch 5 is turned to be in the ON state. Operation of the power amplifier 100 in this state is as follows.

The signal input unit 1 outputs a PWM pulse train that is pulse width modulated according to an error integral value between the input signal Vin and the feedback signal. In the output stage 2, the N-channel transistor 21 is turned to be in the OFF state and the N-channel transistor 22 is turned to be in the ON state in a period in which the output signal of the signal input unit 1 is at the L level. Meanwhile, a negative terminal of the DC power supply 32 is connected to the output node 23 via the N-channel transistor 22, and a differential voltage between the output node 23 and the reference node 33 (a positive terminal of the DC power supply 32) is supplied to the speaker 7 via the filter 6.

On the other hand, when the output signal of the signal input unit 1 is at the H level, the N-channel transistor 21 is turned to be in the ON state and the N-channel transistor 22 is turned to be in the OFF state. Meanwhile, the positive terminal of the DC power supply 31 is connected to the output node 23 via the N-channel transistor 21, and a voltage between the output node 23 and the reference node 33 (a negative terminal of the DC power supply 31) is supplied to the speaker 7 via the filter 6.

In the feedback circuit 4, the inverting amplifier 41 inverts and amplifies the differential voltage between the output node 23 of the output stage 2 and the ground line, and the inverting amplifier 42 inverts and amplifies the differential voltage between the reference node 33 and the ground line with the same gain as that of the inverting amplifier 41. The differential amplifier 43 inverts and amplifies a difference between the output signal of the inverting amplifier 41 and the output signal of the inverting amplifier 42 and feeds the amplified difference back to the inverting input terminal of the operational amplifier 11 of the signal input unit 1. Thus, an amplification operation of the input signal Vin in the power amplifier 100 is performed while the output voltage of the output stage 2 of the power amplifier 100 is being negatively fed back to the signal input unit 1.

Figure 3:
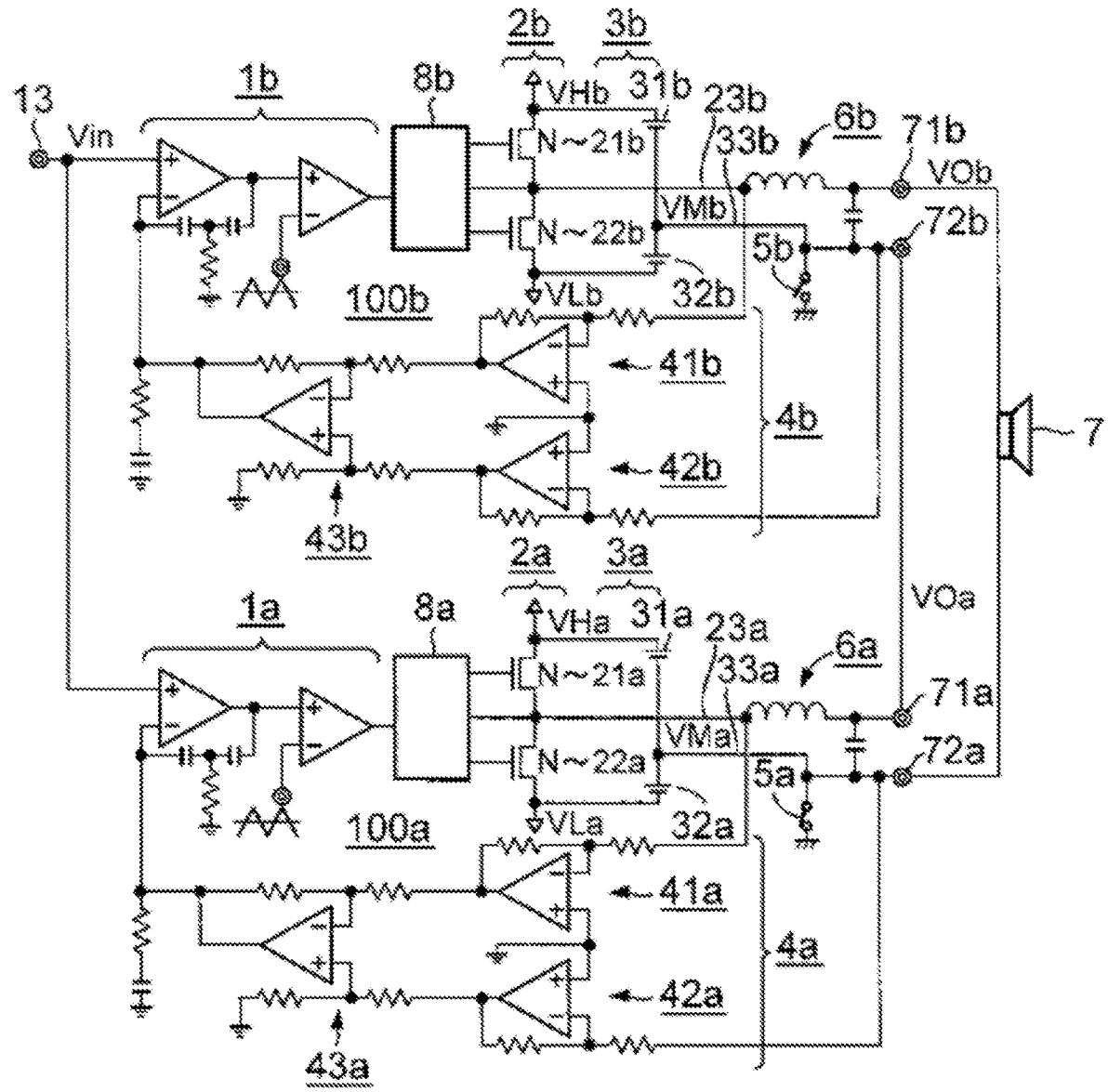
FIG. 3 is a circuit diagram showing a configuration example of a power amplifier in which output stages of two power amplification units are connected in series.

FIG. 3 is a circuit diagram showing a configuration in which two power amplifiers 100 are connected in series. In FIG. 3, power amplification units 100a and 100b are the power amplifiers 100 shown in FIG. 2, respectively. Hereinafter, elements belonging to the power amplification unit 100a are denoted by reference signs with the letter "a" appended thereto. Similarly, elements belonging to the power amplification unit 100b are denoted by reference signs with the letter "b" appended thereto.

As shown in FIG. 3, a speaker terminal 71a of the power amplification unit 100a is connected to a speaker terminal 72b of the power amplification unit 100b. A speaker 7 is connected between a speaker terminal 72a of the power amplification unit 100a and a speaker terminal 71b of the power amplification unit 100b. In addition, a reference potential switch 5a of the power amplification unit 100a is in the ON state and a reference potential switch 5b of the power amplification unit 100b is in the OFF state. An input signal Vin is supplied from an input terminal 13 to a signal input unit 1a of the power amplification unit 100a and a signal input unit 1b of the power amplification unit 100b.

Figure 4A:
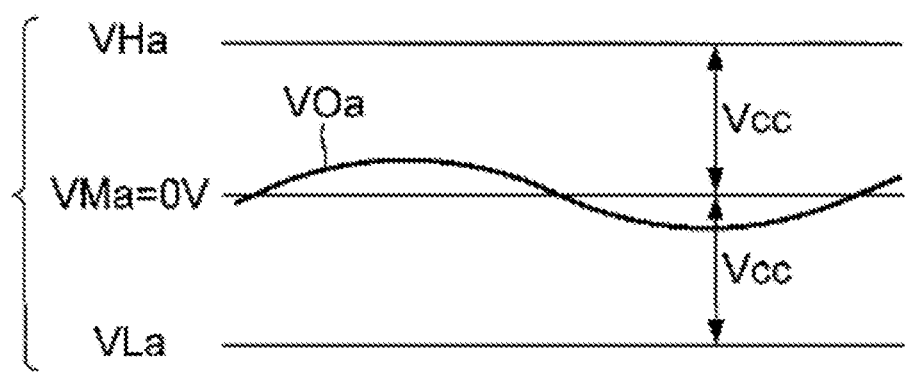
FIG. 4A is a waveform diagram showing a waveform of each unit of the power amplifier.
Figure 4B:
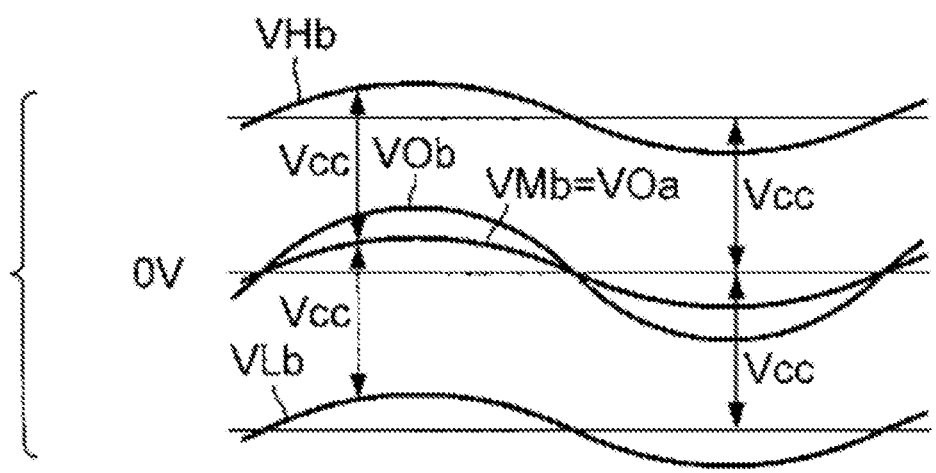
FIG. 4B is a waveform diagram showing a waveform of each unit of the power amplifier.

FIGS. 4A and 4B are waveform diagrams showing a waveform of each unit of the power amplifier shown in FIG. 3. Hereinafter, an operation of the power amplifier shown in FIG. 3 will be described with reference to this waveform diagram.

In the power amplification unit 100a, since the reference potential switch 5a is in the ON state, a reference potential VMa of a reference node 33a of an output stage 2a is 0 V, as shown in FIG. 4A. Therefore, when each of power supply voltages of DC power supplies 31a and 32a is set to Vcc, a potential VHa of a positive terminal of a floating power supply 3a is Vcc and a potential VLa of a negative terminal of the floating power supply 3a is −Vcc, as shown in FIG. 4A. When the output stage 2a is switched by a PWM pulse train supplied from the signal input unit 1a, an AC voltage VOa oscillating about a reference potential VMa=0 V is generated between the speaker terminals 71a and 72a, as shown in FIG. 4A.

Furthermore, in the power amplification unit 100b, since the reference potential switch 5b is in the OFF state and the speaker terminal 72b is connected to the speaker terminal 71a. Accordingly, as shown in FIG. 4B, a reference potential VMb of a reference node 33b of an output stage 2b becomes a potential obtained by adding an AC voltage VOa output by the power amplification unit 100a to the reference potential VMa=0 V on the power amplification unit 100a side. Therefore, when each of the power supply voltages of DC power supplies 31b and 32b is set to Vcc, a potential VHb of a positive terminal of a floating power supply 3b becomes VOa+Vcc and a potential VLa of a negative terminal of the floating power supply 3b becomes VOa−Vcc, as shown in FIG. 4B. When the output stage 2b is switched by the PWM pulse train supplied from the signal input unit 1b, an AC voltage VOb oscillating about the reference potential VMb=VOa is generated between the speaker terminals 71b and 72b, as shown in FIG. 4B. Thus, with the power amplifier shown in FIG. 3, a voltage obtained by adding the voltages output by the power amplification units 100a and 100b can be applied to the speaker 7.

Meanwhile, in the power amplification unit 100a, a differential voltage between an output node 23a of the output stage 2a and the reference node 33a is fed back to the signal input unit 1a by a feedback circuit 4a. In the power amplification unit 100b, a differential voltage between an output node 23b of the output stage 2b and the reference node 33b is fed back to the signal input unit 1b by a feedback circuit 4b. In this case, feedback signals having the same voltage waveform are fed back to the signal inputs 1a and 1b by the feedback circuits 4a and 4b. Reasons for this will be described below.

First, in the power amplification unit 100a, a potential of the output node 23a of the output stage 2a is inverted and amplified by the inverting amplifier 41a. Furthermore, the potential VMa=0 V of the reference node 33a is inverted and amplified by the inverting amplifier 42a. An output signal of each of the inverting amplifiers 41a and 42a is inverted and amplified by a differential amplifier 43a, and then a feedback signal is applied from the differential amplifier 43a to the signal input unit 1a.

Meanwhile, in the power amplification unit 100b, a potential of the output node 23b of the output stage 2b is inverted and amplified by the inverting amplifier 41b. Furthermore, the potential VMb=VOa of the reference node 33b is inverted and amplified by the inverting amplifier 42b. An output signal of each of the inverting amplifiers 41b and 42b is inverted and amplified by a differential amplifiers 43b, and then a feedback signal is applied from the differential amplifier 43b to the signal input unit 1b.

Suppose a case in which a PWM pulse train having the same waveform as the PWM pulse train, which is supplied from the signal input unit 1a to the output stage 2a, is supplied from the signal input unit 1b to the output stage 2b. In this case, the differential voltage waveform between the output node 23b of the output stage 2b and the reference node 33b is the same as a differential voltage waveform between the output node 23a of the output stage 2a and the reference node 33a. Accordingly, a waveform of each of potentials of the output node 23b of the output stage 2b and the reference node 33b becomes a waveform obtained by adding the voltage VOa of the speaker terminal 71a as an in-phase component to a waveform of each of the potentials of the output node 23a of the output stage 2a and the reference node 33a. In the feedback circuit 4b, this in-phase component is removed by the differential amplifier 43b. Therefore, the feedback signal applied from the feedback circuit 4b to the signal input unit 1b is the same as the feedback signal applied from the feedback circuit 4a to the signal input unit 1a. The same input signal Vin and the same feedback signal are applied to the signal input units 1a and 1b. Therefore, the PWM pulse train supplied from the signal input unit 1a to the output stage 2a and the PWM pulse train supplied from the signal input unit 1b to the output stage 2b have the same waveform. Thus, in the power amplifier shown in FIG. 3, the same voltages are fed back to the signal input units 1a and 1b by the feedback circuits 4a and 4b.

As described above, the embodiment enables one power amplifier 100 to be used as the sole power amplifier as shown in FIG. 2. Alternatively, the embodiment enables the two power amplification units 100a and 100b to be connected in series and be used as shown in FIG. 3, in which each of the power amplification units 100a and 100b corresponds to the power amplifier 100. When the two power amplification units 100a and 100b are connected in series and are used, the voltage obtained by adding the output voltages of the two power amplification units 100a and 100b can be applied to the speaker 7, which is an object to be driven. Although not shown, in the configuration shown in FIG. 3, the reference potential switches 5a and 5b of the two power amplification units 100a and 100b may both be turned in the ON state, so that the speaker 7 is driven, with the power amplification units 100a and 100b being connected in parallel.

Furthermore, in the embodiment, the output stage 2 is electrically isolated from the signal input unit 1 and driven by the floating power supply 3. In addition, the reference potential switch 5 is provided between the reference node of the floating power supply 3 and the reference potential line. Furthermore, in the embodiment, the voltage applied from the output stage 2 to an object to be driven is differentially amplified by the feedback circuit 4 and fed back to the signal input unit 1.

In the embodiment, the two power amplification units 100a and 100b are connected in series. In this configuration, the reference potential switch 5a of one power amplification unit 100a is turned to be in the ON state and the reference potential switch 5b of the other power amplification unit 100b is turned to be in the OFF state. Consequently, in the power amplification units 100a and 100b, the respective output voltage is fed back to the signal input units 1a and 1b due to the feedback circuits 4a and 4b having the same configuration in the power amplification units 100a and 100b.

Other Embodiments

Although an embodiment of the present disclosure has been described above, other embodiments are conceivable from the present disclosure. For example, such embodiments follow.

Figure 5:
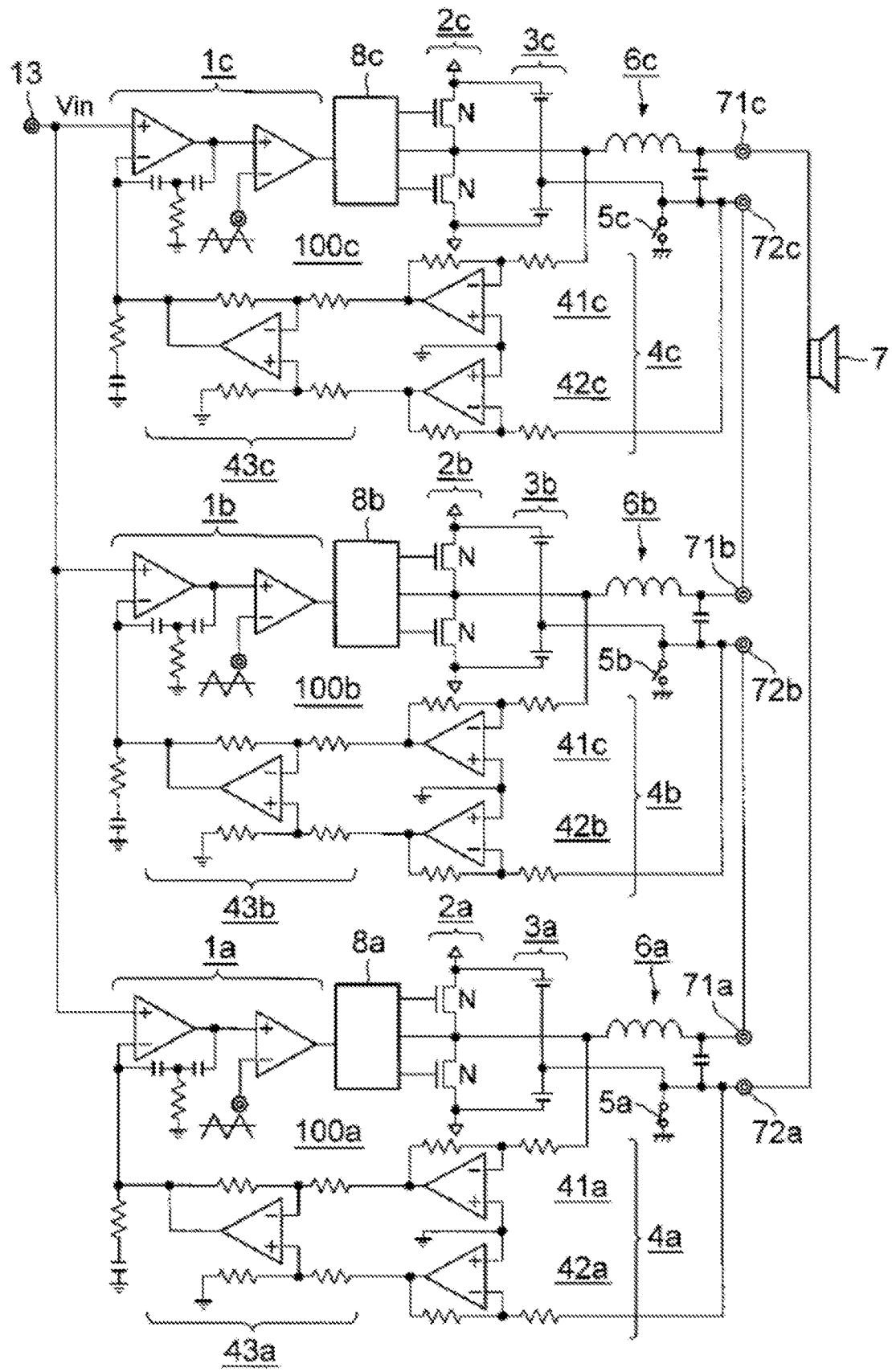
FIG. 5 is a circuit diagram showing a configuration of a power amplifier according to another embodiment of the present disclosure.

(1) Although the two power amplification units 100a and 100b are connected in series in the embodiment, three or more power amplification units may be connected in series to drive the speaker 7. FIG. 5 is a circuit diagram showing a configuration of a power amplifier in which three power-amplification units 100a, 100b, and 100c are connected in series. In this power amplifier, a speaker terminal 71a of the power amplification unit 100a is connected to a speaker terminal 72b of the power amplification unit 100b. The speaker terminal 71b of the power amplification unit 100b is connected to a speaker terminal 72c of the power amplification unit 100c. The speaker 7 is connected between the speaker terminal 72a of the power amplification unit 100a and the speaker terminal 71c of the power amplification unit 100c. Furthermore, a reference potential switch 5a of the power amplification unit 100a is in the ON state, a reference potential switch 5b of the power amplification unit 100b is in the OFF state, and a reference potential switch 5c of the power amplification unit 100c is in the OFF state. An input signal Vin is supplied from the input terminal 13 to a signal input unit 1a of the power amplification unit 100a, a signal input unit 1b of the power amplification unit 100b, and a signal input unit 1c of the power amplification unit 100c. Accordingly, this aspect enables a voltage obtained by adding output voltages of the power amplification units 100a, 100b, and 100c to be applied to the speaker 7.

Figure 6:
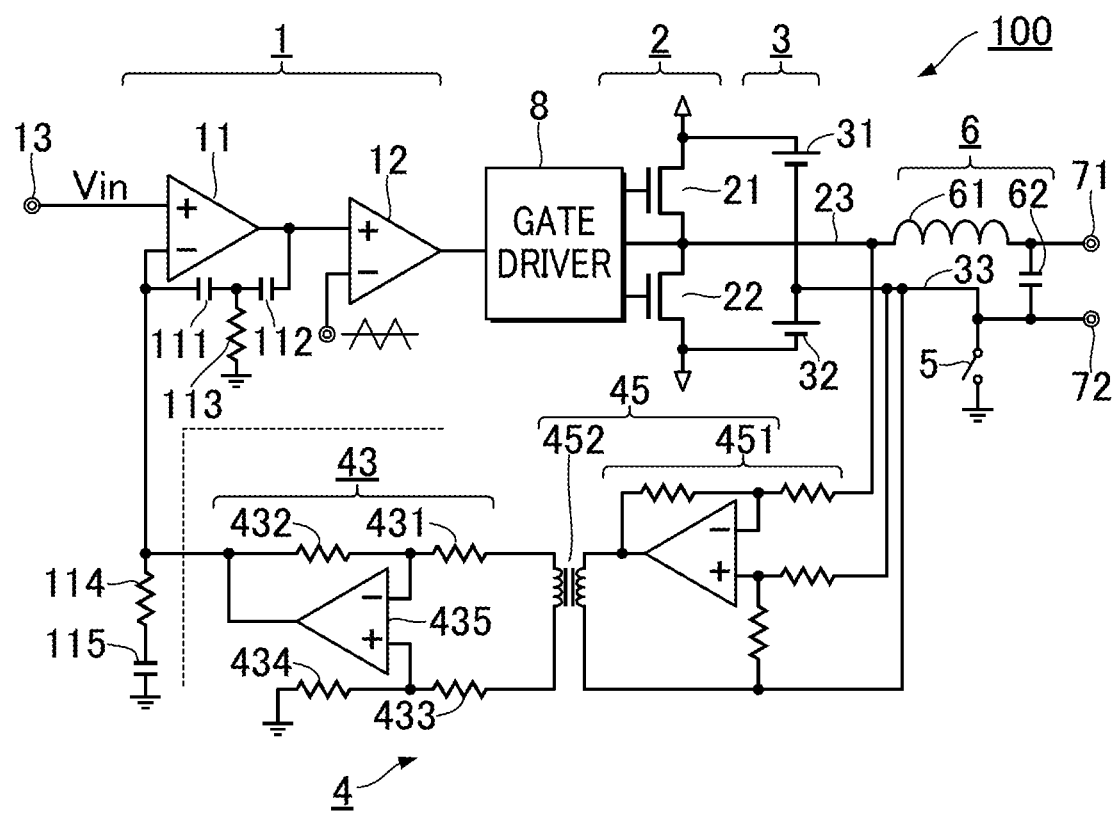
FIG. 6 is a circuit diagram showing a configuration of a power amplifier according to a modification.
Figure 7:
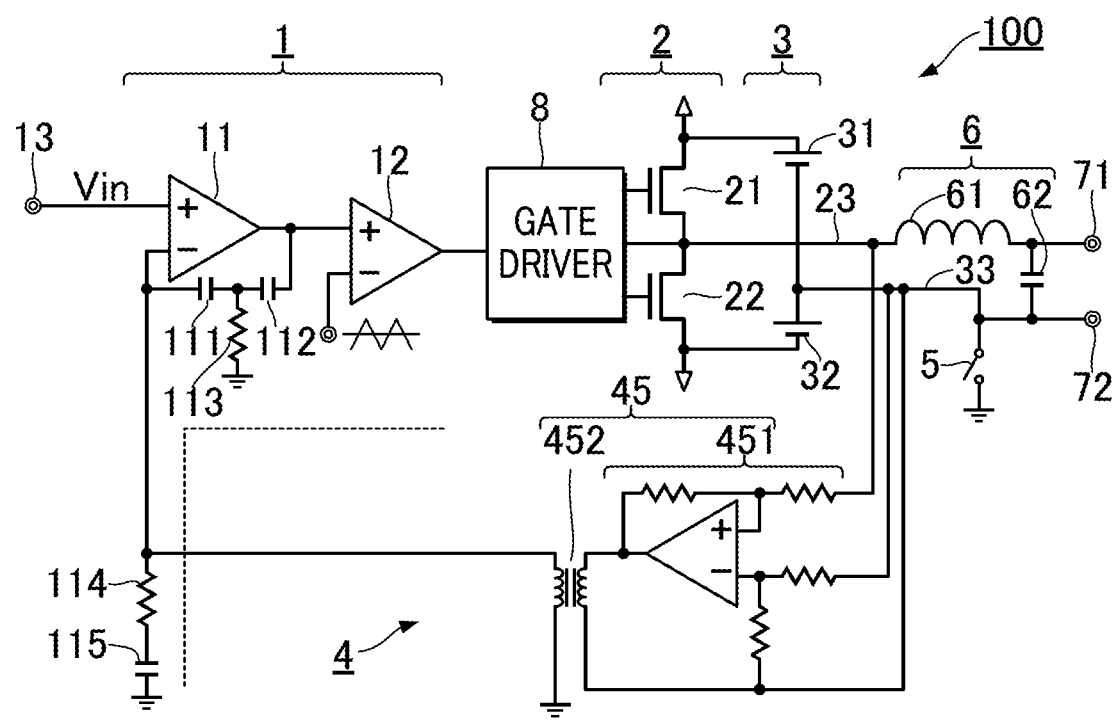
FIG. 7 is a circuit diagram showing a configuration of a power amplifier according to a modification.

(2) As shown in FIG. 6, the inverting amplifiers 41 and 42 in the feedback circuit 4 of the embodiment described above may be replaced with an isolation type amplifier (isolation amplifier) 45. The isolation type amplifier 45 includes an inverting amplifier 451 and an isolation transformer 452. A primary coil of the isolation transformer 452 is connected between an output terminal of the inverting amplifier 451 and the reference node 33. Furthermore, a secondary coil of the isolation transformer 452 is connected between input terminals of the differential amplifier 43. A gain of the isolation type amplifier 45 (eventually, a total gain of the differential amplifier 43) may be set to a desired value according to a turn ratio between the primary coil and the secondary coil of the isolation transformer 452. In addition, as shown in FIG. 7, amplification in the differential amplifier 43 may be realized by the isolation type amplifier 45. That is, the differential amplifier 43 may be omitted. In the configuration in FIG. 7, the total gain of the differential amplifier 43 is set to a desired value according to the turn ratio of the isolation transformer 452 in the isolation type amplifier 45.

Figure 8:
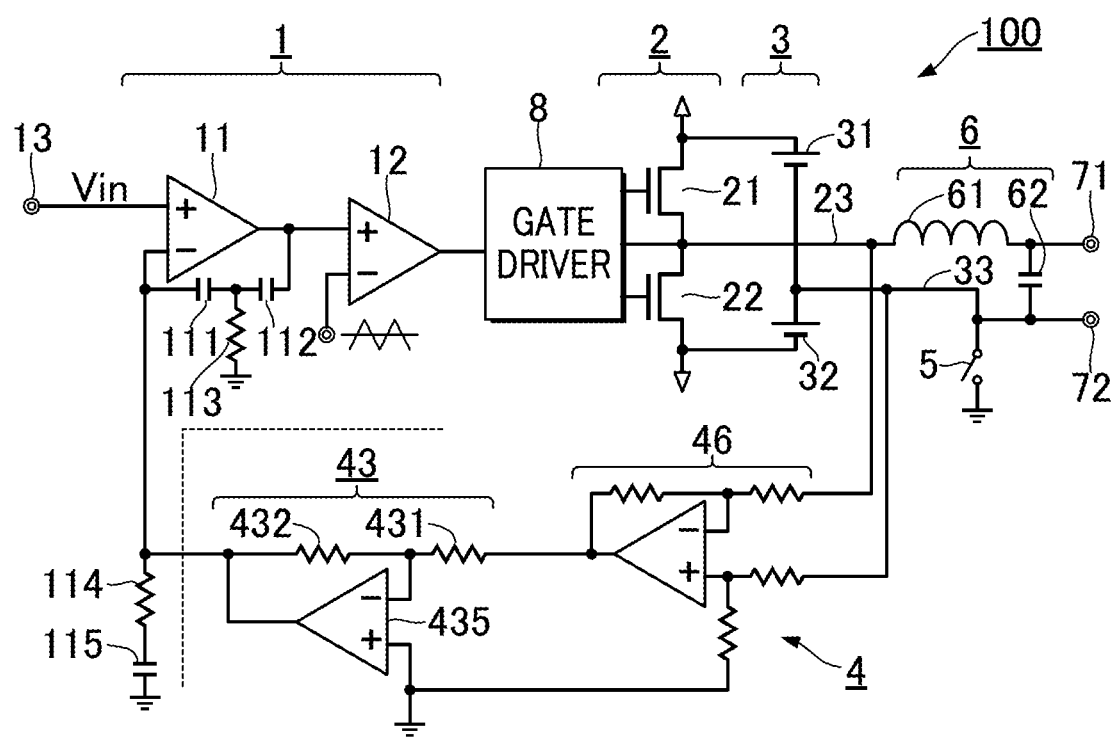
FIG. 8 is a circuit diagram showing a configuration of a power amplifier according to a modification.

(3) As shown in FIG. 8, the inverting amplifiers 41 and 42 in the feedback circuit 4 of the embodiment may be replaced with one differential input amplifier 46. The differential input amplifier 46 inverts a polarity of a differential voltage between the output node 23 of the output stage 2 and the reference node 33 of the floating power supply 3 and amplifies the differential voltage. A voltage at an output terminal of the differential input amplifier 46 is output with reference to a reference voltage (the same ground line as the non-inverting input terminal) of the differential amplifier 43 (the inverting input terminal of the operational amplifier 435), and is supplied to an inverting input terminal of the differential amplifier 43.

(4) Although the voltage of a stage before the filter 6 (that is, the voltage between the output node 23 and the reference node 33) is fed back to the signal input unit 1 in the embodiment described above, a voltage of a stage (that is, the speaker terminals 71 and 72) after the filter 6 may be fed back to the signal input unit 1 by the feedback circuit 4, in addition to the above configuration.

Figure 9:
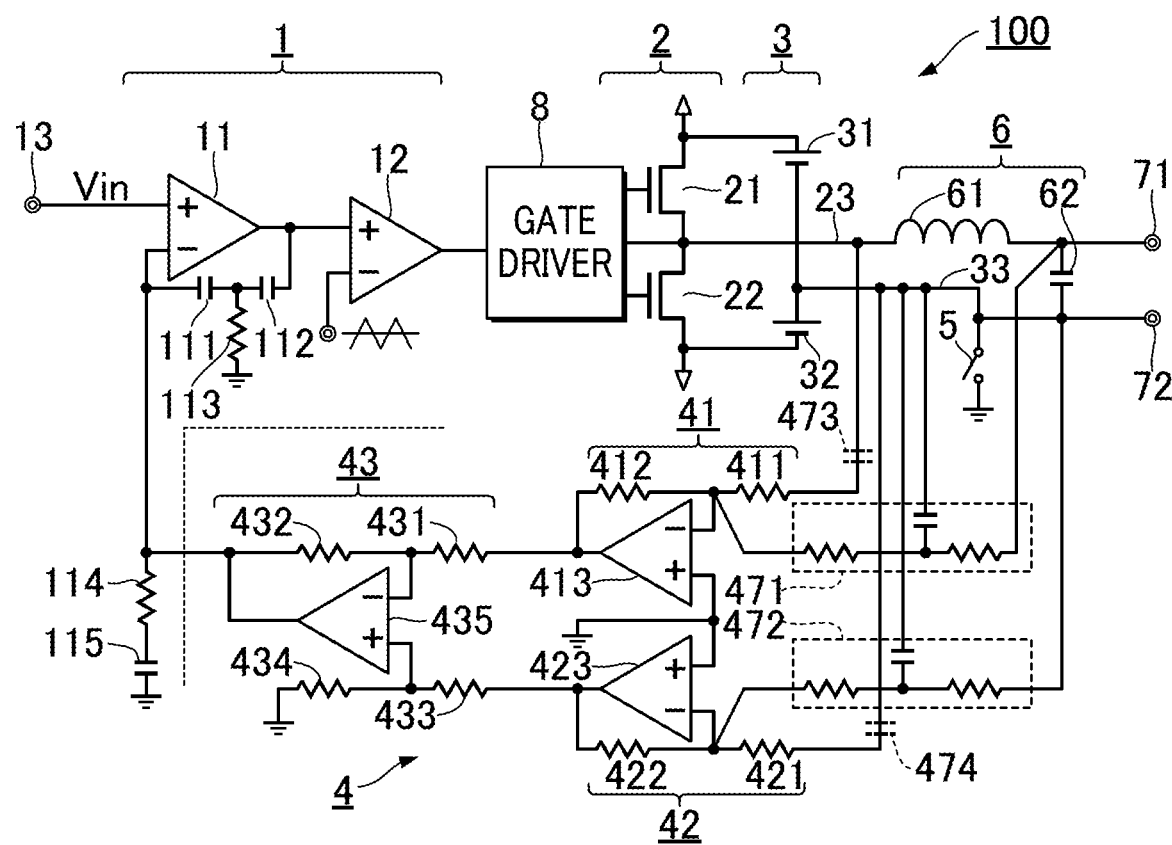
FIG. 9 is a circuit diagram showing a configuration of a power amplifier according to a modification.

For example, as shown in FIG. 9, a voltage of the speaker terminal 71 located at a stage after the filter 6 may be supplied to the inverting input terminal of the operational amplifier 413 in the inverting amplifier 41 via a low pass filter 471. Furthermore, a voltage of the speaker terminal 72 located at the stage after the filter 6 (that is, a voltage of the reference node 33) may be supplied to the inverting input terminal of the operational amplifier 423 in the inverting amplifier 42 via a low pass filter 472. Each of the low pass filters 471 and 472 includes, for example, a resistor and a capacitor, and passes components in an audio band (for example, band components at 20 kHz or less) included in the voltage of the stage after the filter 6. As will be understood from the above description, the feedback circuit 4 in FIG. 9 feeds the differential voltage between the output node 23 and the reference node 33 back to the signal input unit 1, similar to the embodiment described above. Furthermore, the feedback circuit 4 amplifies components in the audio band included in the voltage between the output node of the filter 6 and the reference node 33 and feeds the amplified differential voltage back to the signal input unit 1.

The above configuration has an advantage in that the voltage actually supplied to the speaker 7 is fed back to the signal input unit 1. As shown by a dotted line in FIG. 9, a capacitor 473 may be connected on a path from the output node 23 to the inverting input terminal of the operational amplifier 413. Furthermore, a capacitor 474 may be connected on a path from the reference node 33 to the inverting input terminal of the operational amplifier 423. The capacitor 473 and the resistor 411 function as a high pass filter to pass, for example, components exceeding an audio band of the voltage of the output node 23. Similarly, the capacitor 474 and the resistor 421 function as a high pass filter to pass, for example, components exceeding the audio band of the voltage of the reference node 33.

(5) In the power amplifier shown in FIG. 3, gains of the power amplification units 100a and 100b may be different. As shown in FIG. 3, even when the gains of the power amplification units 100a and 100b are different, in-phase components between voltage signals at the speaker terminals 71b and 72b of the power amplification unit 100b (that is, in-phase components caused by the output voltage of the power amplification unit 100a) are canceled out in the differential amplifier 43b. Accordingly, the same effect as described above can be obtained.

(6) The embodiment describes, as an example of the power amplifier according to the present disclosure, a separately excited class-D amplifier that generates a PWM pulse train using a carrier signal generated by a periodic waveform generating circuit. However, the power amplifier according to the present disclosure may be a self-excited class-D amplifier that generates a PWM pulse train using self-excited oscillation that occurs in a closed loop including an output stage and a feedback circuit. Furthermore, the power amplifier according to the present disclosure may be a power amplifier other than a class-D amplifier.

(7) Although the floating power supply 3 is configured with the two DC power supplies 31 and 32 in the embodiment, a configuration of the floating power supply 3 is freely selected. For example, the floating power supply 3 may be configured with one DC power supply. Furthermore, although a neutral point of the floating power supply 3 is set as the reference node 33 in the embodiment, a node that is not a neutral point may be set as the reference node 33.

(8) A plurality of sets power amplifiers connected in series may be provided, and each of these sets may be connected in a Bridged Transless (BTL) manner.

Figure 10:
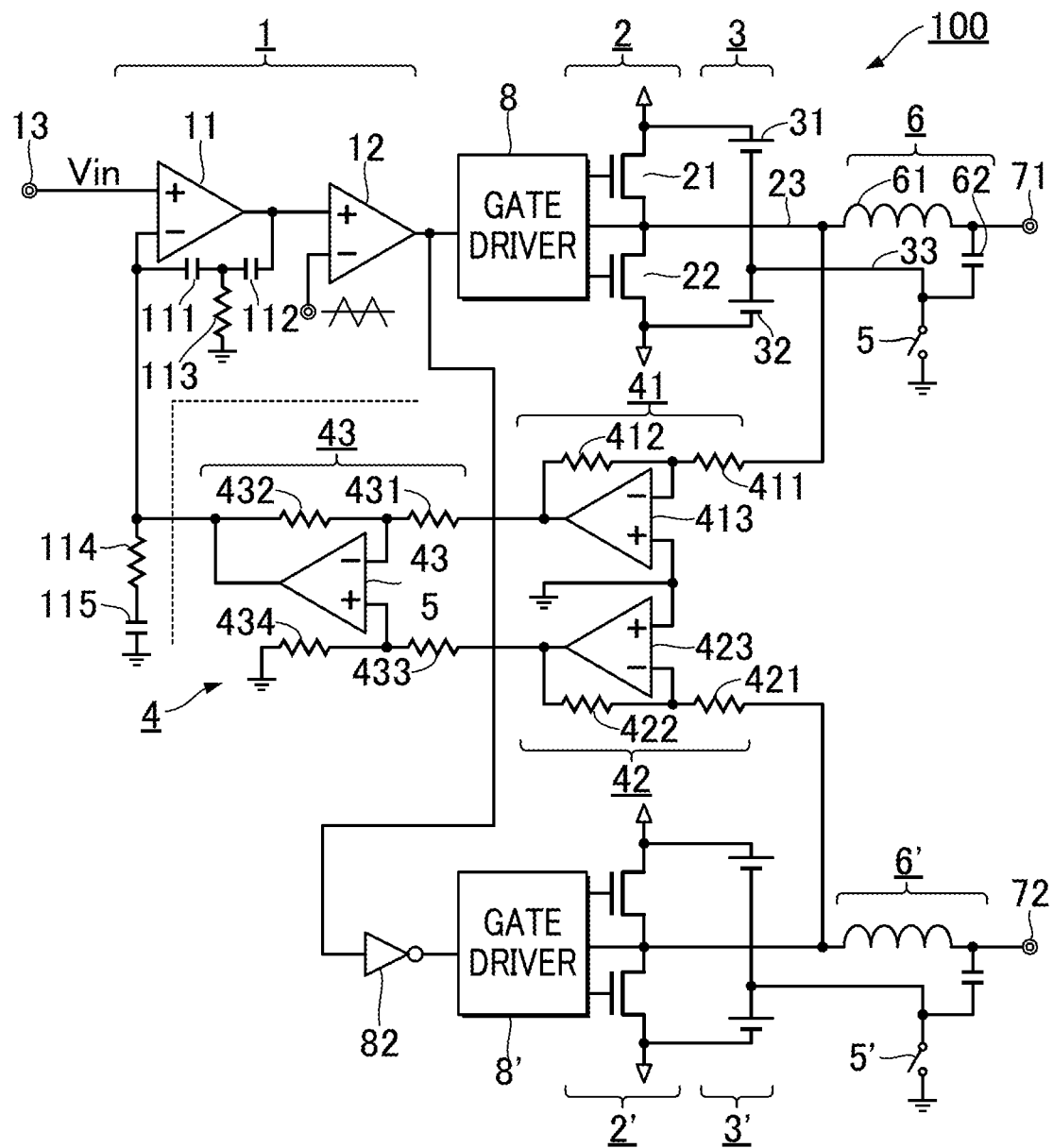
FIG. 10 is a circuit diagram showing a configuration of a power amplifier according to a modification.

For example, as shown in FIG. 10, an inverting circuit 82, an isolation type gate driver 8', an output stage 2', a reference potential switch 5', and a filter 6' may be added to the embodiment described above. The inverting circuit 82 inverts the output signal from the signal input unit 1 and inputs the resultant signal to the isolation type gate driver 8'. The isolation type gate driver 8', the output stage 2', and the filter 6' operate similarly to the isolation type gate driver 8, the output stage 2, and the filter 6 in the embodiment described above. A speaker terminal 71 is installed on the output side of the filter 6 on the positive phase side, and a speaker terminal 72 is installed on the output side of the filter 6' on the negative phase side. Although FIG. 10 shows the floating power supply 3' separate from the floating power supply 3 for convenience, the floating power supply 3 is actually shared as the floating power supply 3'. In a case in which the floating power supply 3 is shared by the positive phase side and the negative phase side, the reference potential switch 5 is shared as the reference potential switch 5'.

Figure 11:
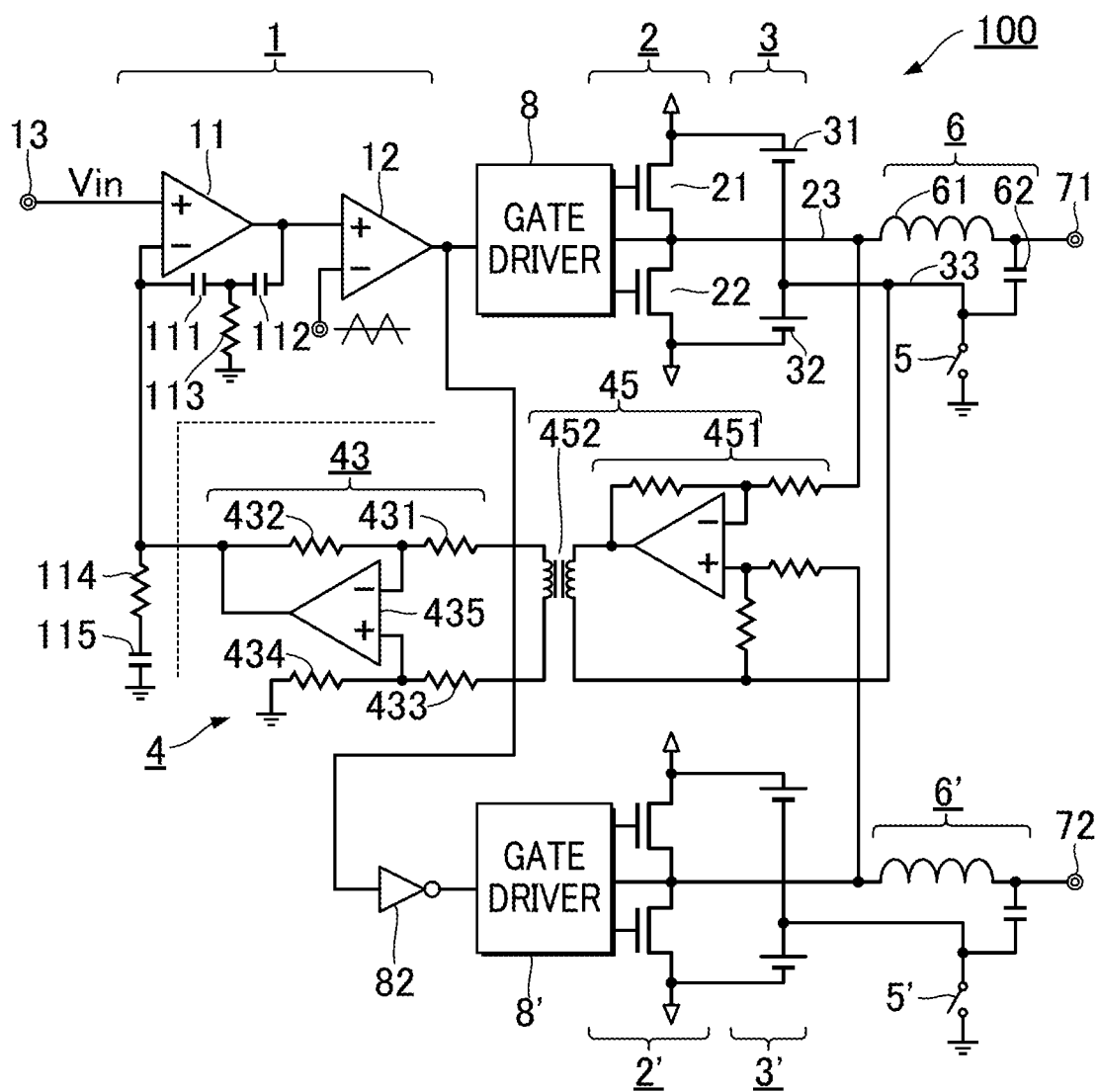
FIG. 11 is a circuit diagram showing a configuration of a power amplifier according to a modification.
Figure 12:
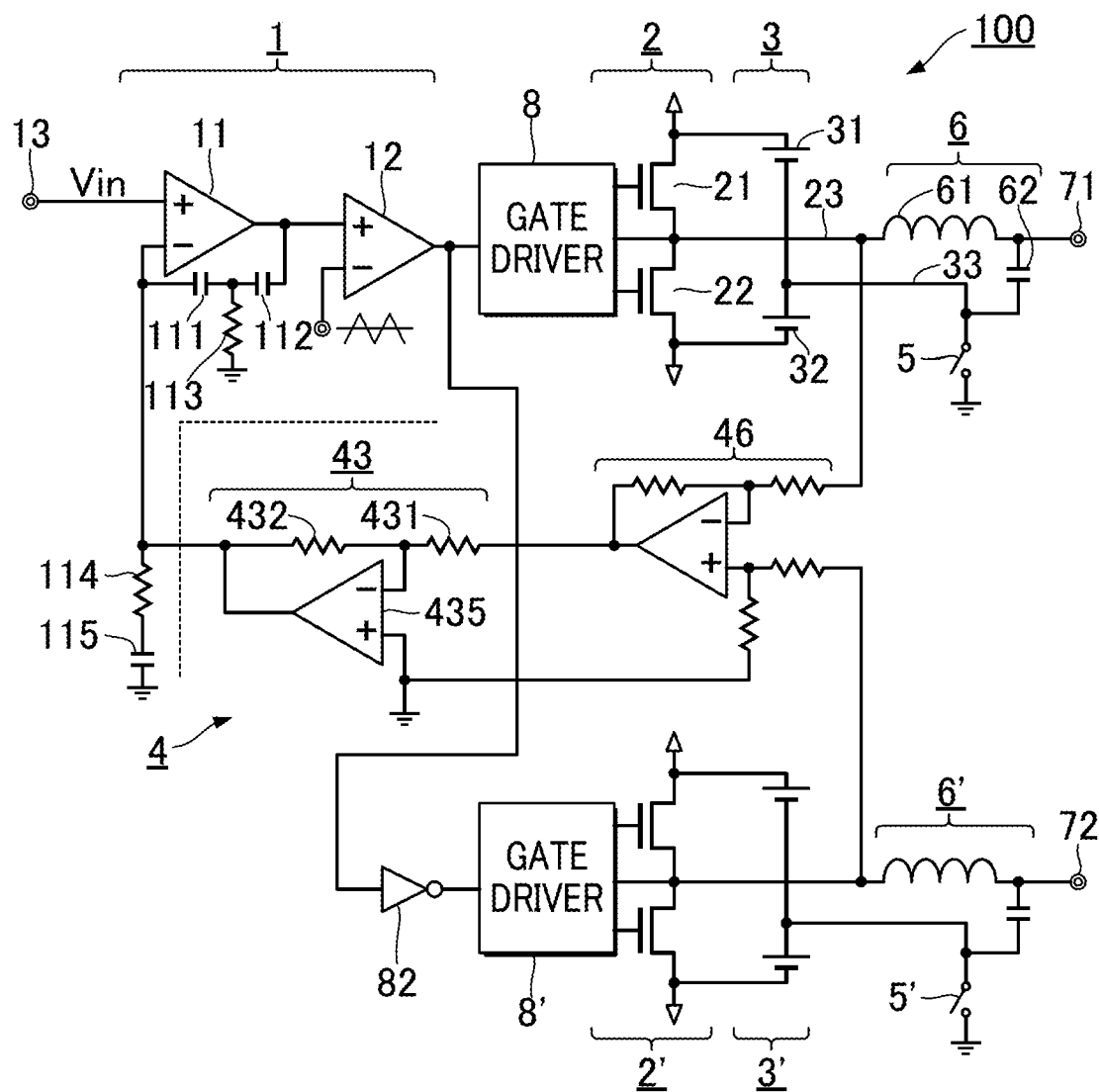
FIG. 12 is a circuit diagram showing a configuration of a power amplifier according to a modification.
Figure 13:
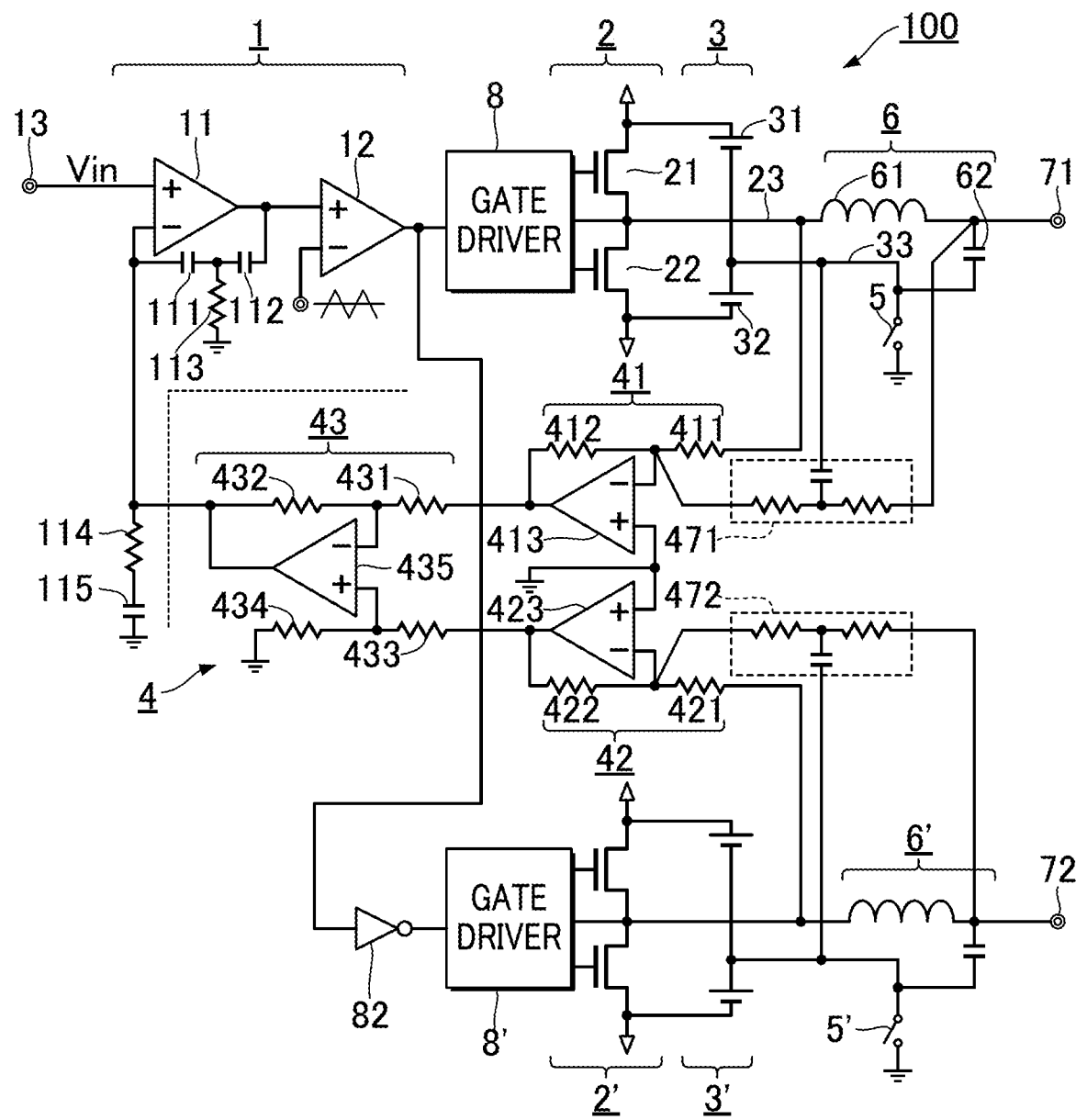
FIG. 13 is a circuit diagram showing a configuration of a power amplifier according to a modification.

The configuration shown in FIGS. 6 to 9 may be adopted for a BTL-connected power amplifier. For example, in the BTL-connected power amplifier as shown in FIG. 11, the inverting amplifiers 41 and 42 may be replaced with the isolation type amplifier 45 as in the example of FIG. 6 or 7. Furthermore, in the BTL-connected power amplifier as shown in FIG. 12, the inverting amplifiers 41 and 42 may be replaced by one differential input amplifier 46, as in the example of FIG. 8. In the BTL-connected power amplifier as shown in FIG. 13, a voltage at a stage after the filter 6 may be fed back to the signal input unit 1 by the feedback circuit 4.

Figure 14:
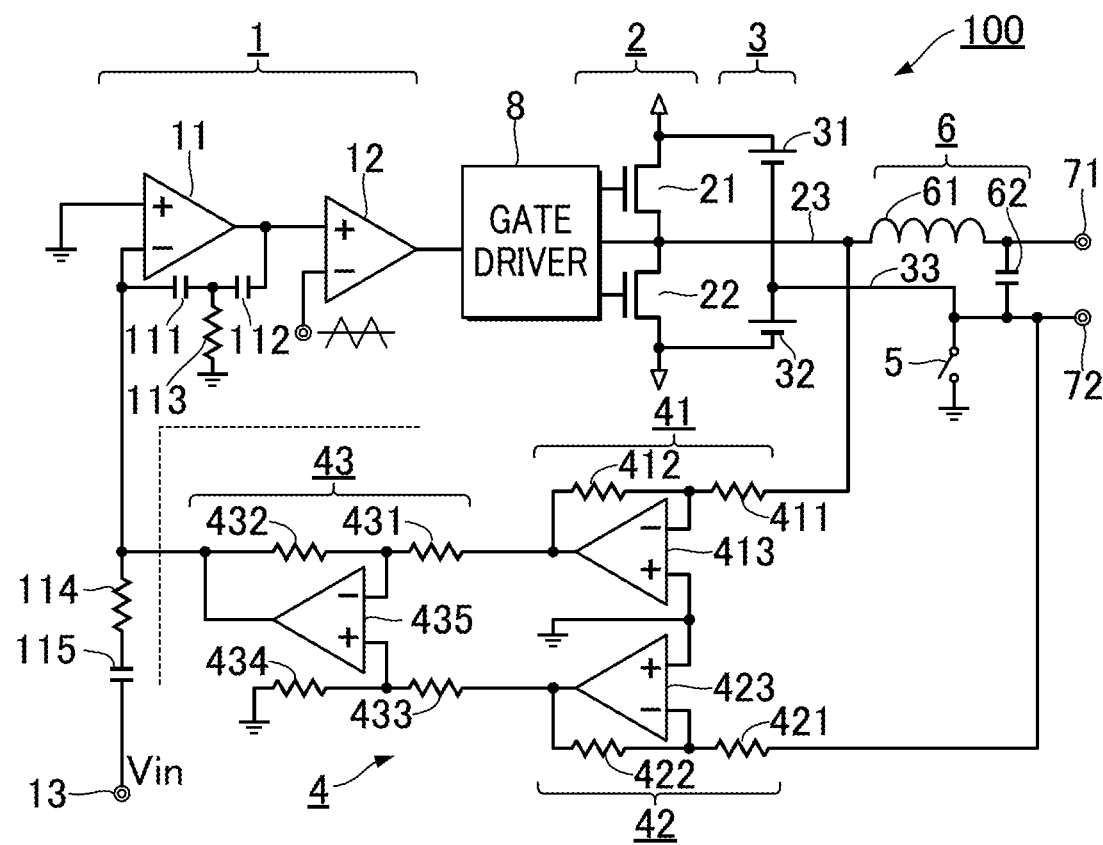
FIG. 14 is a circuit diagram showing a configuration of a power amplifier according to a modification.

(9) Although the embodiment shows the non-inverting type power amplifier 100, the present disclosure may be applied to an inverting type power amplifier. FIG. 14 is a circuit diagram showing a configuration of the inverting type power amplifier. As shown in FIG. 14, in the inverting type power amplifier, an input terminal 13 is connected to an inverting input terminal of an operational amplifier 11 in a signal input unit 1 via a capacitor 115 and a resistor 114. A non-inverting input terminal of the operational amplifier 11 is grounded. In the configuration shown in FIG. 14, for example, an inverting circuit (not shown) is provided at a stage before the power amplifier. A non-inverting type power amplifier including the inverting circuit and an inverting type power amplifier is configured as a whole.

(10) A plurality of sets of power amplifiers connected in series may be provided and connected in parallel.

(11) In the embodiments detailed above, examples of specific modifications of the present disclosure will now be described.

A power amplifier according to a preferred embodiment of the present disclosure includes: a signal input unit to which an input signal is applied; an output stage that is electrically isolated from the signal input unit, where the output stage is configured to amplify an output signal of the signal input unit based on a power supply voltage from a floating power supply; a reference potential switch that is inserted between a reference node of the power supply voltage generated by the floating power supply and a reference potential line; and a feedback circuit configured to amplify a differential voltage between the reference node and an object driven by an output of the output stage, and feed the amplified voltage back to the signal input unit.

It is possible to use multiple power amplifiers in combination, in addition to using one power amplifier alone. In the present disclosure, an example of a use aspect of a characteristic power amplifier includes an aspect in which output stages of power amplifiers are connected in series for use. For example, in a case in which two power amplifiers are used, a common input signal is applied to signal inputs of the two power amplifiers. In this case, a reference potential of one of the power amplifiers (hereinafter referred to as a first power amplifier) is turned to be in the ON state, and a reference potential switch of the other power amplifier (hereafter, a second power amplifier) is turned to be in the OFF state. An output stage of the first power amplifier, an output stage of the second power amplifier, and a load are connected in series.

In this configuration, the load is driven by a voltage obtained by adding an output voltage of the output stage of the first power amplifier to an output voltage of the output stage of the second power amplifier. Consequently, a current flows through the load. In this case, the output voltage of the second power amplifier is a voltage on which the output voltage of the first power amplifier is superimposed. However, in the first power amplifier, the output voltage is amplified with reference of the reference potential of the floating power supply by the feedback circuit and is fed back to the signal input units. The same is true of the second power amplifier. For example, potentials of the two nodes (one of the two nodes is the reference node) at which the output voltage of the second power amplifier is generated include the in-phase component caused by the output voltage of the first power amplifier. However, this in-phase component is canceled out in the feedback circuit and does not affect the feedback to the signal input unit. Therefore, it is possible to realize a series connection without changing a circuit configuration of the feedback circuit between the two power amplifiers. Although the series connection of two power amplifiers has been described by way of example, the same applies to a case in which three or more power amplifiers are connected in series.

In a preferred aspect of the present disclosure, the feedback circuit includes a first inverting amplifier configured to invert and amplify a voltage for the object driven by the output of the output stage, a second inverting amplifier configured to invert and amplify a voltage of the reference node of the floating power supply, and a differential amplifier configured to invert and amplify a difference between an output signal of the first inverting amplifier and an output signal of the second inverting amplifier.

The power amplifier according to a preferred embodiment of the present disclosure includes a filter configured to pass components in a specific band included in a differential voltage between an output node of the output stage and the reference node of the floating power supply, in which the feedback circuit amplifies components in an audio band included in the differential voltage between the output node and the reference node and the voltage between an output node of the filter and the reference node, and feeds the amplified differential voltage back to the signal input unit.

A power amplifier according to another aspect of the present disclosure includes two or more power amplification units, in which each of the two or more power amplification units includes: a signal input unit to which an input signal is applied; an output stage that is electrically isolated from the signal input unit, where the output stage is configured to amplify an output signal of the signal input unit based on a power supply voltage from a floating power supply; a reference potential switch that is inserted between a reference node of the power supply voltage generated by the floating power supply and a reference potential line; and a feedback circuit configured to amplify a differential voltage between the reference node and an object driven by an output of the output stage, and feed the amplified differential voltage back to the signal input unit.

DESCRIPTION OF REFERENCE SIGNS

100: Power amplifier
100a, 100b, 100c: Power amplification unit
1, 1a, 1b, 1c: Signal input unit 8, 8a, 8b, 8c: Insulation type gate driver
3, 3a, 3b, 3c: Floating power supply
6, 6a, 6b, 6c: Filter
71, 71a, 71b, 71c, 72, 72a, 72b, 72c: Speaker terminal
7: Speaker
4, 4a, 4b, 4c: Feedback circuit
41, 41a, 41b, 41c, 42, 42a, 42b, 42c: Inverting amplifier
43, 43a, 43b, 43c: Differential amplifier
5, 5a, 5b, 5c: Reference potential switch

What is claimed is:

1. A power amplifier comprising:
    a signal input unit to which an input signal is applied;
    an output stage that is electrically isolated from the signal input unit, where the output stage is configured to amplify an output signal of the signal input unit based on a power supply voltage from a floating power supply;
    a reference potential switch that is inserted between a reference node of the power supply voltage generated by the floating power supply and a reference potential line; and
    a feedback circuit configured to amplify a differential voltage between the reference node and an object driven by an output of the output stage, and feed the amplified differential voltage back to the signal input unit.

2. The power amplifier according to claim 1, wherein the feedback circuit includes:
    a first inverting amplifier configured to invert and amplify a voltage for the object driven by the output of the output stage;
    a second inverting amplifier configured to invert and amplify a voltage of the reference node of the floating power supply; and
    a differential amplifier configured to invert and amplify a difference between an output signal of the first inverting amplifier and an output signal of the second inverting amplifier.

3. The power amplifier according to claim 1, further comprising a filter configured to pass components in a specific band included in a differential voltage between an output node of the output stage and the reference node of the floating power supply, and
    wherein the feedback circuit is configured to amplify components in an audio band included in the differential voltage between the output node and the reference node and a differential voltage between an output node of the filter and the reference node, and feeds the amplified differential voltage back to the signal input unit.

4. A power amplifier comprising: two or more power amplification units, wherein each of the two or more power amplification units includes:
    a signal input unit to which an input signal is applied;
    an output stage that is electrically isolated from the signal input unit, where the output stage is configured to amplify an output signal of the signal input unit based on a power supply voltage from a floating power supply;
    a reference potential switch that is inserted between a reference node of the power supply voltage generated by the floating power supply and a reference potential line; and
    a feedback circuit configured to amplify a differential voltage between the reference node and an object driven by an output of the output stage, and feed the amplified differential voltage back to the signal input unit.

* * * * *